United States Patent
Bofferding et al.

(10) Patent No.: US 10,657,002 B2
(45) Date of Patent: May 19, 2020

(54) METHOD AND APPARATUS TO ROLLBACK MEMORY DIMM LANE SPARING

(71) Applicant: International Business Machines Corporation, Armonk, NY (US)

(72) Inventors: Nicholas E. Bofferding, Cedar Park, TX (US); Andrew J. Geissler, Austin, TX (US); Michael C. Hollinger, Austin, TX (US); Adriana Kobylak, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 15/809,566

(22) Filed: Nov. 10, 2017

(65) Prior Publication Data

US 2019/0146880 A1 May 16, 2019

(51) Int. Cl.
*G06F 11/14* (2006.01)
*G06F 11/20* (2006.01)

(52) U.S. Cl.
CPC ...... *G06F 11/1423* (2013.01); *G06F 11/2025* (2013.01); *G06F 11/2028* (2013.01); *G06F 11/2033* (2013.01)

(58) Field of Classification Search
CPC .................................................. G06F 11/1423
USPC ......... 714/42, 6.1, 6.11, 6.12, 6.13, 6.2, 6.3, 714/6.31, 6.32
See application file for complete search history.

(56) References Cited

U.S. PATENT DOCUMENTS

| | | | |
|---|---|---|---|
| 6,327,680 B1 | 12/2001 | Gervais et al. | |
| 6,836,859 B2 | 12/2004 | Berg et al. | |
| 6,976,197 B2* | 12/2005 | Faust | G06F 11/1048 714/718 |
| 7,370,238 B2 | 5/2008 | Billick et al. | |
| 8,234,540 B2 | 7/2012 | Buchmann et al. | |
| 8,572,441 B2 | 10/2013 | Gove et al. | |
| 9,058,276 B2* | 6/2015 | Stephens | G06F 11/1004 |

(Continued)

FOREIGN PATENT DOCUMENTS

| | | |
|---|---|---|
| KR | 1020150079883 A | 12/2012 |
| WO | 2016071329 A1 | 5/2016 |

OTHER PUBLICATIONS ip.com Disclosure No. IPCOM000177063D, Dec. 4, 2008, [Accessed Online Apr. 19, 2017] [Abstract Only] http://priorart.ip.com/IPCOM/000177063.

*Primary Examiner* — Kamini B Patel
(74) *Attorney, Agent, or Firm* — Patterson + Sheridan, LLP

(57) ABSTRACT

A method for correcting improper repair actions in a computer system includes assigning a first algorithm identifier to a first algorithm and storing the first algorithm identifier and a first input to the first algorithm. The method includes executing the first algorithm with the first input and storing one or more results of the first algorithm, where the one or more results includes a repair action. The method includes determining that the repair action is faulty and storing the algorithm identifier for the first algorithm in a blacklist. The method also includes assigning a second algorithm identifier to a second algorithm and storing the second algorithm identifier and a second input to the second algorithm. The method includes executing the second algorithm with the second input, where the second algorithm corrects the faulty repair action caused by the first algorithm, and storing a result of the second algorithm.

20 Claims, 4 Drawing Sheets

(56) References Cited

U.S. PATENT DOCUMENTS

| | | | |
|---|---|---|---|
| 2008/0010435 A1* | 1/2008 | Smith | G06F 11/1076 |
| | | | 712/10 |
| 2008/0195902 A1* | 8/2008 | Astigarraga | G11C 29/24 |
| | | | 714/720 |
| 2009/0031078 A1* | 1/2009 | Warnes | G11C 5/04 |
| | | | 711/105 |
| 2010/0005202 A1* | 1/2010 | Ferraiolo | G06F 11/2007 |
| | | | 710/51 |
| 2010/0100966 A1* | 4/2010 | Hamid | G06F 21/575 |
| | | | 726/26 |
| 2010/0162037 A1 | 6/2010 | Maule et al. | |
| 2012/0300563 A1* | 11/2012 | Kim | G06F 11/1028 |
| | | | 365/193 |
| 2013/0346736 A1* | 12/2013 | Cook | G06F 9/4416 |
| | | | 713/2 |
| 2015/0170145 A1* | 6/2015 | Patel | G06F 8/20 |
| | | | 705/44 |
| 2017/0039372 A1* | 2/2017 | Koval | G01D 4/004 |
| 2017/0123879 A1* | 5/2017 | Donlin | G06F 11/0727 |
| 2017/0220404 A1* | 8/2017 | Polar Seminario | |
| | | | G06F 11/1417 |
| 2017/0337097 A1* | 11/2017 | Sipos | G06F 11/079 |
| 2018/0059950 A1* | 3/2018 | Gupta | G06F 11/142 |
| 2019/0227886 A1* | 7/2019 | Glancy | G11C 29/52 |

* cited by examiner

METHOD AND APPARATUS TO ROLLBACK MEMORY DIMM LANE SPARING

BACKGROUND

The present invention relates to computer systems, and more specifically, to rolling back sub-optimal changes in a computer system.

Many advanced computer systems have reliability/availability/serviceability (RAS) features that enable the continued operation of the computer system even under adverse failure conditions. One such RAS feature of memory modules, such as a dual in-line memory module (DIMM), is known as lane sparing. If boot firmware detects an error in a communication path within a DIMM, the firmware can configure the DIMM to instead use a spare path, which ensures continued reliable operation. When the firmware makes such a repair, the firmware stores the repair information into the affected DIMM's serial presence data (SPD), which is a small non-volatile memory residing on the DIMM. On subsequent system boots, the boot firmware consults the SPD to determine which lanes have been marked as bad, so as to program the memory controller to correctly communicate with the remaining good lanes on the DIMM. Thus, the DIMM SPD acts as a cache so that diagnostics can be performed only once, to avoid the time penalty of performing these diagnostics every time the system is booted.

If the boot firmware applies too many repairs to a given DIMM over time, the supply of repair paths will be exhausted. When the supply of repair paths is exhausted, the DIMM will become unusable and need to be replaced.

Assuming all DIMM lane sparing algorithms are legitimate, this RAS feature can increase the mean time to failure of the memory subsystem. However, sometimes firmware may be released with a sub-optimal diagnostics routine that falsely detects DIMM communication path faults and applies lane sparing when it is not needed, which shortens the useful lifespan of the DIMM. This results in expensive DIMM triage, service interruptions, physical replacements and the like. In typical systems, there are no easily accessible options to clear the repair information outside the manufacturing line. Further, that ability is generally not given to customers because they may inadvertently remove data that is needed for analysis.

SUMMARY

According to one embodiment of the present invention, a method for correcting improper repair actions in a computer system includes assigning a first algorithm identifier to a first algorithm and storing the first algorithm identifier and a first input to the first algorithm. The method includes executing the first algorithm with the first input and storing one or more results of the first algorithm, where the one or more results includes a repair action. The method includes determining that the repair action is faulty and storing the algorithm identifier for the first algorithm in a blacklist. The method also includes assigning a second algorithm identifier to a second algorithm and storing the second algorithm identifier and a second input to the second algorithm. The method includes executing the second algorithm with the second input, where the second algorithm corrects the faulty repair action caused by the first algorithm, and storing a result of the second algorithm.

According to another embodiment, a system includes a processor and a memory storing a program, which, when executed on the processor, performs an operation for correcting improper repair actions. The operation includes assigning a first algorithm identifier to a first algorithm and storing the first algorithm identifier and a first input to the first algorithm. The operation includes executing the first algorithm with the first input and storing one or more results of the first algorithm, where the one or more results includes a repair action. The operation includes determining that the repair action is faulty and storing the algorithm identifier for the first algorithm in a blacklist. The operation also includes assigning a second algorithm identifier to a second algorithm and storing the second algorithm identifier and a second input to the second algorithm. The operation includes executing the second algorithm with the second input, where the second algorithm corrects the faulty repair action caused by the first algorithm, and storing a result of the second algorithm.

According to another embodiment, a computer program product for correcting improper repair actions includes a computer-readable medium program having program instructions embodied therewith, the program instructions executable by a processor to perform an operation. The operation includes assigning a first algorithm identifier to a first algorithm and storing the first algorithm identifier and a first input to the first algorithm. The operation includes executing the first algorithm with the first input and storing one or more results of the first algorithm, where the one or more results includes a repair action. The operation includes determining that the repair action is faulty and storing the algorithm identifier for the first algorithm in a blacklist. The operation also includes assigning a second algorithm identifier to a second algorithm and storing the second algorithm identifier and a second input to the second algorithm. The operation includes executing the second algorithm with the second input, where the second algorithm corrects the faulty repair action caused by the first algorithm, and storing a result of the second algorithm.

BRIEF DESCRIPTION OF THE SEVERAL VIEWS OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments described herein disclose techniques for releasing follow-up firmware updates that corrects errors found in prior firmware updates. In the embodiments described below, unnecessary repair actions associated with faulty algorithms or faulty inputs to those algorithms can be removed, while leaving known good repair actions in place.

Diagnostics can then be re-run on the newly presumed-good communication paths with the new algorithms and inputs, to verify that they are functioning correctly. In addition, these corrective actions can be performed transparently to the customer, and save on major expenses related to support and repair costs.

Figure 1:
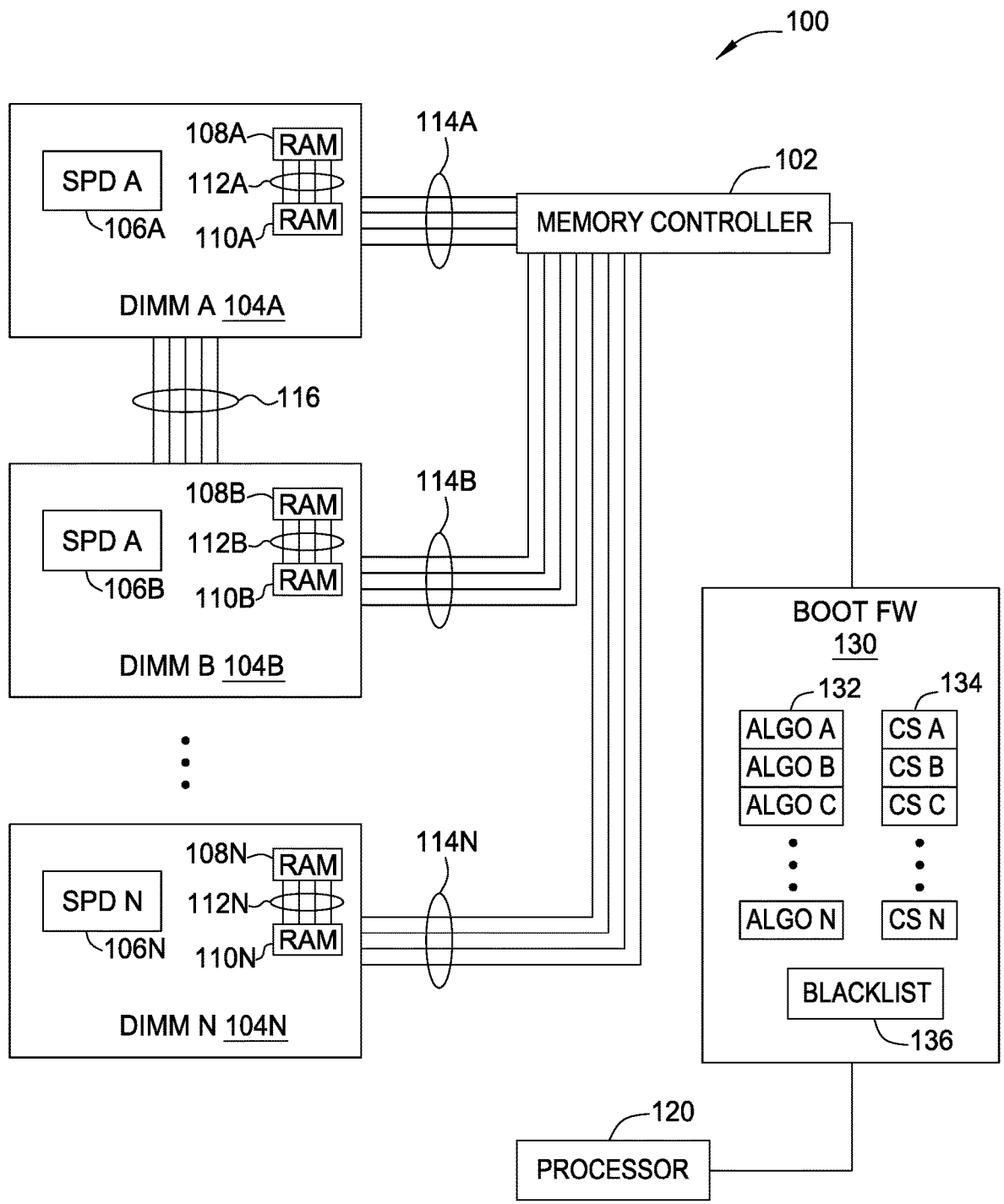
FIG. 1 illustrates a block diagram of a computer memory system according to an embodiment.

FIG. 1 illustrates a block diagram of a computer system 100 according to an embodiment. System 100 comprises a memory controller 102, processor 120, boot firmware 130, and one or more DIMMs 104A-104N. Elements designated by a number followed by a letter may be referred to collectively using the number alone. For example, DIMMs 104A-104N may be referred to collectively as DIMMs 104. In other embodiments, processor 120 may include memory controller 102. Boot firmware 130 may be stored in any suitable location on any suitable chip.

DIMMs 104 comprise one or more memory modules 108A-108N and 110A-110N. Two memory modules are illustrated for each DIMM for simplicity, although any other number of memory modules may be used. In this example, memory modules 108A-N and 110A-N may be dynamic random-access memory (DRAM) devices. Memory modules 108 and 110 may be coupled to one another via a number of links or lanes, illustrated as 112A-112N. Any number of lanes may be used. In addition, DIMMs 104 may be coupled to one another via one or more lanes 116. Memory controller 102 may communicate with DIMMs via lanes 114A-N. Any number of lanes 114 may be used in other embodiments.

DIMMs 104 further comprise serial presence data (SPD) 106A-N. DIMM A 104 includes SPD A 106, DIMM B 104 includes SPD B 106, etc. SPD 106 is used to store information about its associated DIMM 104. For example, if a bad lane is found during memory DIMM diagnostics, that information can be stored in SPD 106 to allow firmware to work around the problem on subsequent boots. Persisting this repair information in SPD 106 allows the repair details to stay with the associated DIMM 104 if that DIMM is moved within the machine or moved to a different machine.

Boot firmware 130 comprises a number of firmware modules or algorithms 132 that may run when system 100 is booted. A number of diagnostics may be run as part of the boot firmware 130. These diagnostics may test DIMMs 104 and other components, as described in further detail below. Boot firmware 130 further comprises checksums 134 for inputs to various algorithms 132. Inputs to the algorithms 132 may include variables such as operating voltage, various frequencies, or other variables that may affect a chip or computing system. In addition, boot firmware 130 comprises a blacklist 136. Boot firmware 130 may be stored in any suitable location, and any suitable processor or controller may operate one or more components of boot firmware 130. In addition, algorithms 132, checksums 134, and blacklist 136 may be stored separately in memory in other embodiments. Algorithms 132 illustrated in boot firmware 130 may change with each version of boot firmware 130. That is, for example, Algorithm C may be present in a first version of boot firmware 130, but might be removed in subsequent versions of boot firmware 130, particularly if it is determined to be a faulty algorithm according to embodiments described herein.

Certain systems may be released with faulty code that is overly aggressive in detecting memory failures. As shown in FIG. 1, multiple lanes may be used to route traffic to and from DIMMs 104, and to route data within DIMMs 104 (such as lanes 112, 114, and 116). If a lane of traffic fails, that lane can be routed around. A spare lane may be used to route data around the faulty lane. If code or an algorithm is released that is faulty, a good memory lane may be erroneously designated as faulty and substituted for a spare lane. If this occurs repeatedly, the spare lanes are exhausted. Once the spare lanes are exhausted, an additional lane failure results in errors that cannot be corrected by substituting another lane. At that point, the DIMM 104 may need to be replaced.

In embodiments described herein, the algorithm or algorithms 132 that are used to detect faulty lanes and substitute spare lanes are tracked and recorded. The inputs to the algorithms 132 are also tracked and recorded via checksums 134. Because this information is tracked, a faulty procedure or algorithm 132 can be undone when it has been detected. The damage caused by the faulty algorithm 132 can be limited or reversed. In addition, a blacklist 136 of faulty algorithms can be stored. The blacklist 136 is a list of known bad algorithms. The blacklist 136 can be written to a source file as a static code structure.

DIMMs and lane sparing are used as an example embodiment herein. The techniques describe herein may be used with other components. For example, two or more processors may communicate with one another over communication lines. Those lines could be spared in a manner similar to DIMM lane sparing. Therefore, the procedures described herein could be used to reverse faulty sparing decisions regarding the communication lines. As another example, spare memory modules 108 may be used in place of memory modules that are found to be faulty via an algorithm. If the algorithm itself is faulty, the procedures described herein could be used to reverse the faulty decision to switch to a spare memory module 108.

Figure 2:
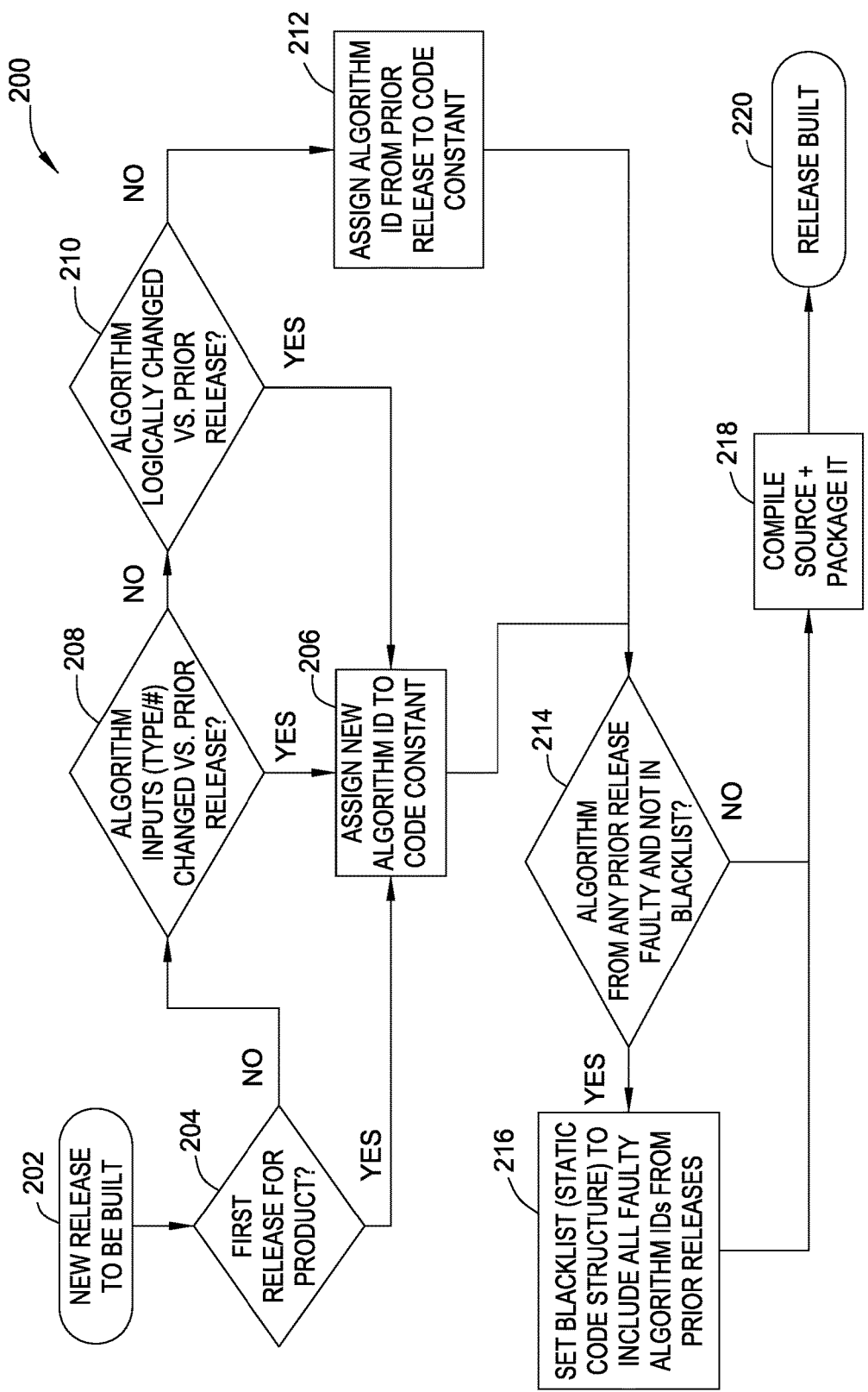
FIG. 2 is a flow diagram of method steps for tracking algorithms, according to an embodiment.

FIG. 2 is a flow diagram of method steps 200 for tracking algorithms according to an embodiment. Although the method steps are described in conjunction with FIG. 1 above, persons skilled in the art will understand that any system configured to perform the method steps, in any order, falls within the scope of the present invention. In various embodiments, the hardware and/or software elements described above in FIG. 1 can be configured to perform the method steps of FIG. 2. Various processors or controllers may perform the steps in FIG. 2, including processor 120 and/or memory controller 102.

When a product is released, the firmware has a number of algorithms 132 in it. Algorithms 132 that create a persistent change in the system (such as lane sparing algorithms) update the SPD 106. These updates remain in SPD 106 even if the system is rebooted, or the code is updated, etc. These algorithms are assigned a specific identifier, referred to herein as an algorithm ID. Therefore a logical set of features is assigned a specific algorithm ID. These algorithms 132 may be run at system boot. For any later release of firmware, the algorithm ID is changed if the algorithm in the new firmware would yield different results than the previous version of the algorithm for the same inputs. If the number or type of inputs fed into the algorithm change in the current version of the firmware relative to the previous version of the firmware, a new algorithm ID is required. The algorithm IDs are written as constants into the source file of the release.

The method begins at step 202. At step 202, the new release is built. If this is the first release for this product, the yes branch of decision block 204 is taken to step 206. At step 206, a new algorithm ID is assigned to the code constant. Then the method proceeds to step 214. At step 214, if there is an algorithm that is faulty and it not in the blacklist 136, the method proceeds to step 216 to add the faulty algorithm ID to the blacklist 136. In this example, this release is the first release for the product (see step 204 above), so there are no algorithms from prior releases to add to the blacklist 136. Therefore the method proceeds to step 218. At step 218, the source is compiled and packaged. The release is built at step 220.

When an algorithm 132 performs an action that creates a persistent change in the system, the algorithm ID is attached to the record of that action. For example, if a DIMM lane is spared, the ID of the algorithm 132 that determined the lane should be spared is recorded and tracked. Then, if that algorithm 132 is later found to be faulty, those actions can be reversed. In addition, the inputs to the algorithm 132 are tracked. These inputs are tracked with the use of a checksum 134 in one embodiment. In other embodiments, other tracking measures besides checksums 134 may be used. The inputs are tracked because an algorithm that is run twice with the same inputs should register the same result. If not, an error may have occurred. If the inputs are different than a previous run of the algorithm, the algorithm needs to be re-run. In addition, in some embodiments, if an algorithm has not changed and the inputs have not changed, the algorithm may not need to be re-run, and instead the previous result may be used.

In the next example, an algorithm 132 has been found to be faulty (for example, algorithm A). Therefore a new code release is needed to fix this problem. The method begins at step 202 with the new release to be built. At decision block 204, this is not the first release for the product so the method proceeds to step 208. At step 208, if the algorithm inputs have changed versus a prior release, a new algorithm ID needs to be assigned. That is, embodiments described herein not only track algorithms but also the inputs to the algorithms, because different inputs can lead to different results for the same algorithm. A new algorithm ID is assigned at step 206. If, however, at step 208 the algorithm inputs have not changed compared to the prior release, the method proceeds to step 210.

At step 210, the method determines if the algorithm has logically changed versus the prior release. If the algorithm has logically changed, the method proceeds to step 206 and a new algorithm ID is assigned. If the algorithm has not logically changed, the method proceeds to step 212. At step 212, the existing algorithm ID from the prior release is assigned to the code constant.

In this example, the algorithm inputs have changed at step 208 so a new algorithm ID is assigned at step 206. Steps 210 and 212 are not used in this example. The method then proceeds to step 214. At step 214, there is an algorithm from a prior release that is faulty and is not in the blacklist (i.e., algorithm A). Therefore the method proceeds to step 216, where algorithm A is registered in the blacklist 136. After algorithm A has been registered in blacklist 136, the source is compiled at step 218 and released at step 220.

Now that algorithm A has been registered in the blacklist, actions that were taken by algorithm A can be reversed. Each action taken by algorithm A that creates a persistent change has been tracked by algorithm ID and stored in SPD 106. These actions can be reviewed, as described in further detail below, and reversed via a new algorithm included in the new code release.

New code releases may be performed for a variety of reasons. Critical releases may be needed to fix bugs that cause serious errors. In other releases, an accumulation of bug fixes may be included. Periodic releases may be performed to add improvements. Some releases may be built for individual customers, while other releases may be sent to every customer or a large group of customers.

One advantage of the embodiments described herein is that the algorithm that made a persistent change can be interrogated. That algorithm can be compared to the blacklist to check if the algorithm is known to be a faulty algorithm. If so, the failure detected by that algorithm may be an incorrect result. The entity that failed can be re-tested. If the entity passes the re-test, it can be re-used. For example, if a DIMM lane is marked as failed and spared, but later passes a re-test, the DIMM lane can be re-used and the spare lane can be freed up for use when a future lane failure occurs. In this example, the DIMM is less likely to run out of spare lanes due to incorrect failures, which will increase the usable life of the DIMM.

Figure 3:
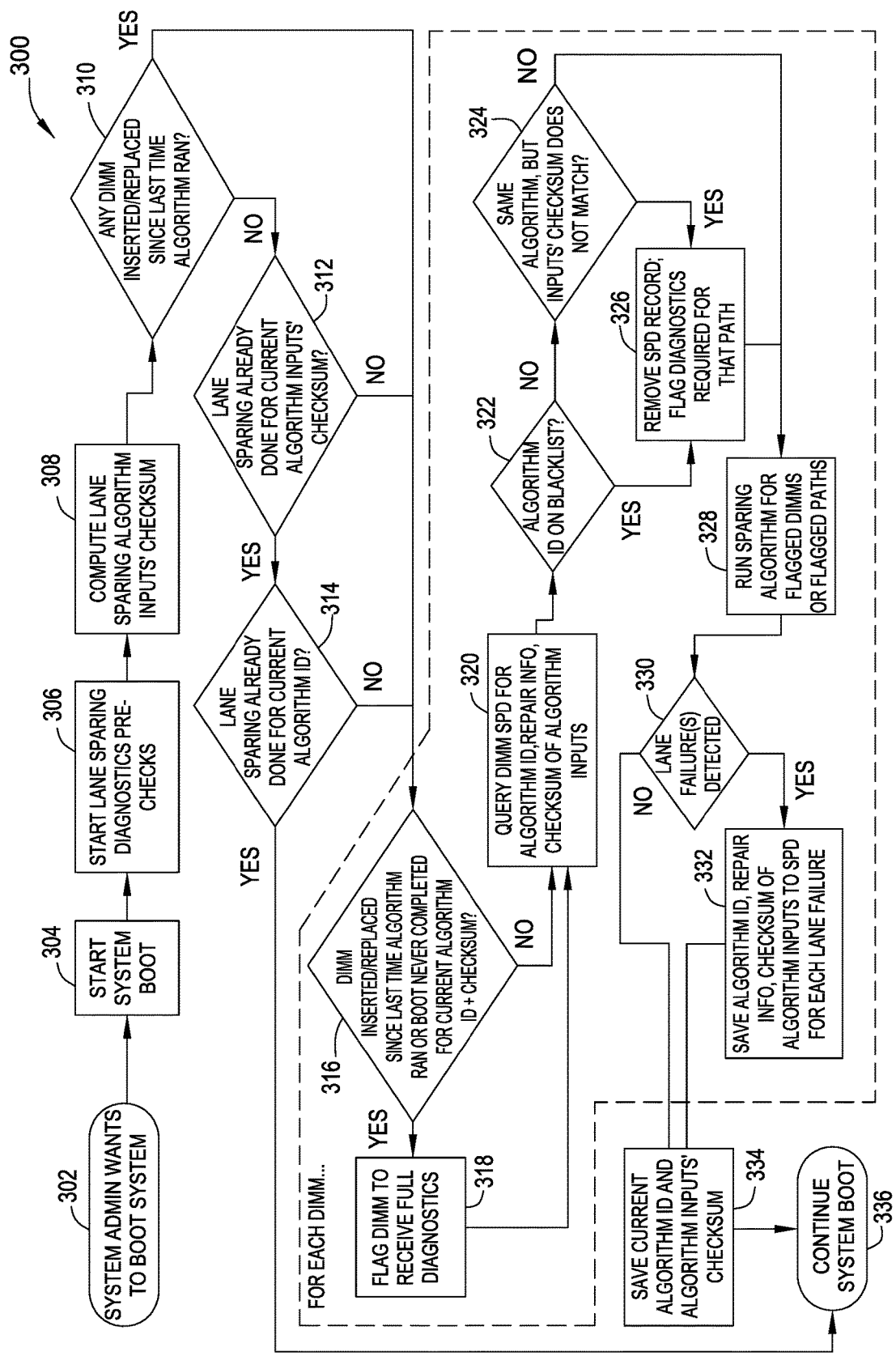
FIG. 3 is a flow diagram of method steps for correcting improper repair actions, according to an embodiment.

FIG. 3 is a flow diagram of method steps 300 for correcting improper repair actions according to an embodiment. Although the method steps are described in conjunction with FIG. 1 above, persons skilled in the art will understand that any system configured to perform the method steps, in any order, falls within the scope of the present invention. In various embodiments, the hardware and/or software elements described above in FIG. 1 can be configured to perform the method steps of FIG. 3. Various processors or controllers may perform the steps in FIG. 3, including processor 120 and/or memory controller 102.

FIG. 3 illustrates how firmware 130 on a computer system operates according to one embodiment. A specific example of DIMM lane sparing is illustrated, but algorithms for other functions may be utilized in other embodiments. This method may be completed for each DIMM in a computer system, or for a subset of DIMMs. For simplicity, this example will describe one lane sparing algorithm. That is, boot firmware includes a lane sparing algorithm. In this example, the method 300 determines whether the lane sparing algorithm has changed compared to a previous lane sparing algorithm in another version of the boot firmware, whether the inputs to the lane sparing algorithm have changed, and whether the lane sparing algorithm is on the blacklist 136. Then the method 300 runs the appropriate lane sparing algorithm and saves certain data to SPD 106 for future iterations.

At step 302, a system admin boots a system, and system boot starts at step 304. At step 306, lane sparing diagnostic pre-checks occur. These are diagnostic checks of memory, such as DIMM memory as illustrated in FIG. 1. At step 308, the checksums of the lane sparing algorithm inputs are computed. That is, each lane sparing algorithm has one or more groups of inputs to the algorithm. Checksums of these groups of inputs are computed to track which inputs have been used with each algorithm. The checksums may be stored in boot firmware and in SPD 106, along with the associated algorithm IDs. The checksums are stored so that future steps of method 300 can determine which inputs have been used with which algorithms.

The method proceeds to decision block 310. Block 310 checks to see if any DIMM has been inserted or replaced since the last time the lane sparing algorithm was run. If yes, the method proceeds directly to step 316. Step 316 is discussed below.

If no DIMM has been inserted or replaced since the last time the lane sparing algorithm was run, the method proceeds to decision block 312. Block 312 checks to see if lane sparing has already been done for the current algorithm inputs. The current inputs are compared to the stored checksums of inputs to determine if the algorithm has been run with these inputs. If the algorithm has not been run with these inputs, the method proceeds to step 316. If, however, the algorithm has been run with these inputs, the method proceeds to decision block 314.

Decision block 314 determines if lane sparing has been performed with the current algorithm ID. If it has been performed, the method proceeds to step 336 and system boot continues. That is, in this scenario, no DIMMs have been replaced or inserted, and lane sparing has been performed with the current lane sparing algorithm ID and with the current inputs to the lane sparing algorithm ID. Therefore, the lane sparing algorithm does not need to be run again during this system boot. By tracking which algorithm has been run, and by tracking the inputs to that algorithm, the time and computing expense of re-performing the lane sparing algorithm can be avoided.

However, if one of the above decision blocks (steps 310, 312, or 314) in the method leads to decision block 316, the method continues at decision block 316. At decision block 316, the firmware determines if a DIMM was inserted or replaced since the last time the algorithm ran, or determines if the boot never completed for the current algorithm ID and checksum. If yes, the method proceeds to step 318 and the DIMM is flagged to receive full diagnostics, and then the method proceeds to step 320. If, at decision block 316, the answer is no, the method proceeds to step 320

At step 320, the DIMM SPD 106 is queried for the lane sparing algorithm ID, repair information, and the checksum of the algorithm inputs. This information is used in later steps in the method. The method then proceeds to step 322, where the algorithm ID is checked against blacklist 136 to determine if this algorithm is on blacklist 136. If the algorithm is not on blacklist 136 in step 322, the method proceeds to step 324. At decision block 324, the algorithm is the same, but decision block 324 determines if input checksums do not match. If the input checksums match, the method proceeds to step 328. If the input checksums do not match, the method proceeds to step 326.

Going back to step 322, if the algorithm ID is on blacklist 136, the method proceeds to step 326. At step 326, the appropriate SPD 106 record is removed. In addition, diagnostics are flagged as being required for the path. That is, in this branch of the flowchart, it has been determined that the algorithm ID is on the blacklist 136 or that the input checksum does not match. If the algorithm ID is on the blacklist 136, diagnostics are required and a new algorithm needs to be run that is not faulty. If the input checksums do not match, the present algorithm needs to be run with the new inputs to determine if a different result occurs. After step 326, the method proceeds to step 328.

At step 328, the lane sparing algorithm is run for flagged DIMMs or flagged paths. DIMMs were flagged in step 318 to receive full diagnostics. Paths were flagged in step 326 to receive diagnostics. If any other those were flagged in a current iteration of the method, the lane sparing algorithm is run in step 328 for the DIMMs or lanes that were flagged. The method then proceeds to step 330.

Decision block 330 determines if lane failures are detected. If there are no lane failures, then no spare lanes need to be utilized. The method then proceeds to step 334. At step 334, the current algorithm ID and input checksum are saved to SPD 106. Then system boot continues at step 336.

At decision block 330, if there are lane failures detected by the lane sparing algorithm, the method proceeds to step 332. At step 332, the algorithm ID, repair information (for the lane failures), and checksum of inputs to the algorithm are saved to the SPD 106 for each lane failure. This is saved in SPD 106 so that it can be referenced in further iterations of the method 300, and so that any faulty algorithms can be corrected in future firmware updates. In other words, step 332 stores the repair information for an individual lane failure into SPD 106. This repair information can be examined the next time firmware is updated and the algorithm ID or input checksum changes. The repair information can also be examined if the DIMM moves within the machine or moves to a new machine. Then the method proceeds to step 334 where the current algorithm ID and input checksum are saved to SPD 106, if they are not already saved there. At step 334, information is recorded such as the fact that a full boot has been completed with the current set of DIMMs using the specified algorithm and input checksum. On the next boot, if the existing DIMM hardware is detected to not have been reseated or replaced, and no new DIMMs have been added, and there is no new algorithm or input checksum, then there is no need to perform additional diagnostics. Therefore step 334 provides performance optimization for an entire machine. The system boot continues at step 336.

Figure 4:
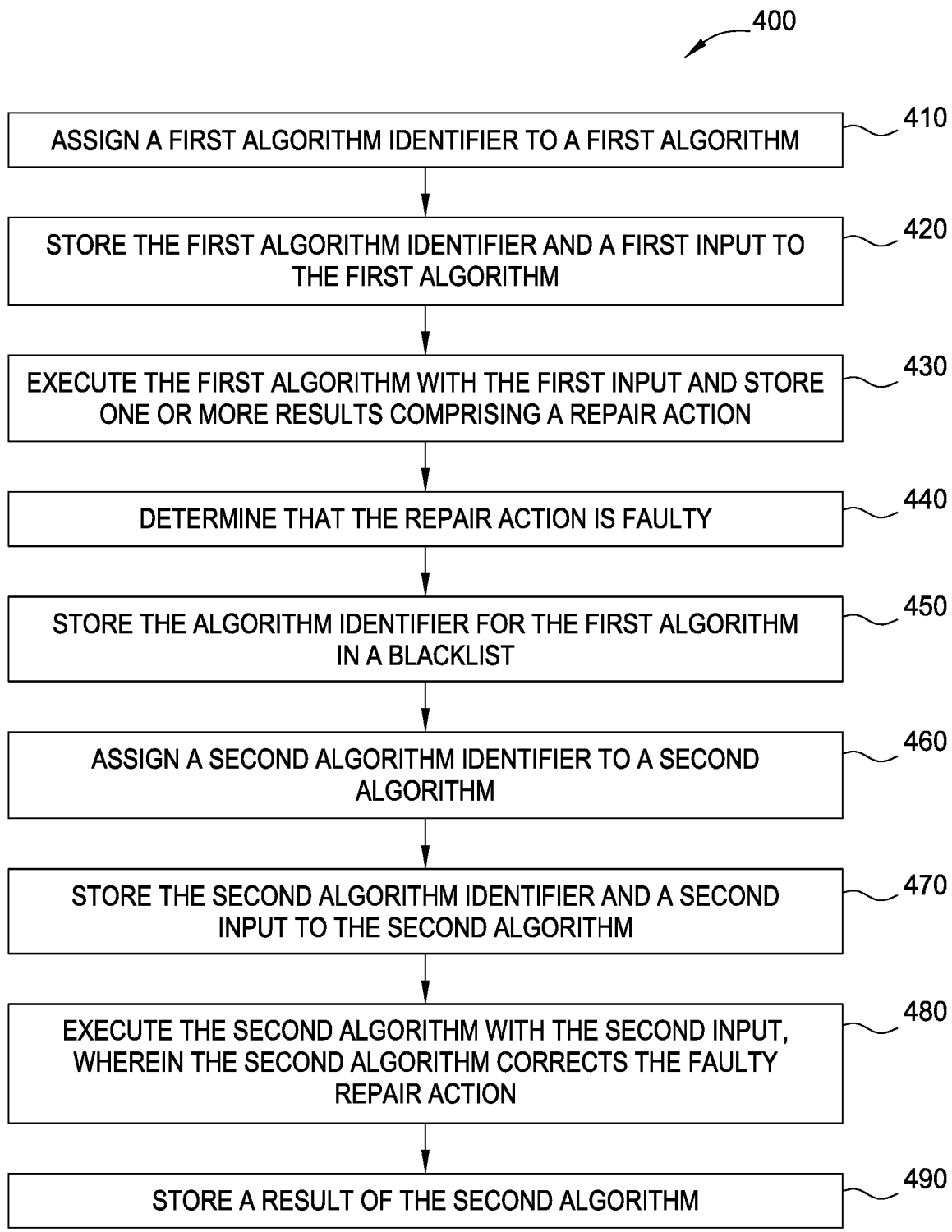
FIG. 4 is a flow diagram of method steps for correcting improper repair actions, according to another embodiment.

FIG. 4 is a flow diagram of method steps 400 for correcting improper repair actions according to an embodiment. Although the method steps are described in conjunction with FIG. 1 above, persons skilled in the art will understand that any system configured to perform the method steps, in any order, falls within the scope of the present invention. In various embodiments, the hardware and/or software elements described above in FIG. 1 can be configured to perform the method steps of FIG. 4. Various processors or controllers may perform the steps in FIG. 4, including processor 120 and/or memory controller 102.

The method begins at step 410, where boot firmware 130 assigns a first algorithm identifier to a first algorithm. In this example, the first algorithm is a DIMM lane sparing algorithm. For later releases of boot firmware 130, the algorithm ID is changed if the new algorithm would yield different results for the same inputs, as described above.

The method continues at step 420, where the first algorithm identifier and any inputs to the first algorithm are stored (referred to herein as first inputs). In a computer system with a DIMM lane sparing algorithm, these values may be stored in SPD on each DIMM. As noted above, inputs may comprise operating voltage, frequency, etc.

At step 430, processor 120 executes the first algorithm with the first input or set of inputs and stores one or more results of the first algorithm. The one or more results comprises a repair action. In this example, if the first algorithm detects that a DIMM lane needs to be spared, the algorithm notifies the memory controller 102 which lane(s) should be used. The result of the first algorithm is also stored in SPD on the associated DIMM. The first algorithm can be run for each DIMM in the computer system, with the results stored for each DIMM in its corresponding SPD as illustrated in FIG. 1. Also, as noted above, these steps can be performed in any suitable order. In some embodiments, the first algorithm is executed and then the algorithm identifier, inputs, and results are stored.

The method proceeds to step 440, where the repair action is determined to be faulty. This determination can be achieved in a number of ways. First, a customer or user of the computer system may report a failure of a DIMM or other component. A serviceperson or the manufacturer might then investigate the failure and determine that one or more DIMMs should not have failed. If the improper failure is traced to a faulty algorithm via an investigation, the computer system may be able to be restored to a working state by rolling back some or all of the changes made by the faulty algorithm or algorithms.

Second, the manufacturer may notice that failures are occurring at a greater frequency than expected, and can then investigate the firmware to determine if an algorithm is registering faulty repairs. Or, a review or test of the firmware by the manufacturer may uncover a faulty algorithm.

Once the first algorithm is determined to be faulty, the algorithm identifier for the first algorithm is stored in a blacklist at step 450. The blacklist can be stored in any suitable location.

The method proceeds to step 460, where boot firmware 130 assigns a second algorithm identifier to a second algorithm. The second algorithm in this example is the new lane sparing algorithm that is included in the firmware update to correct the errors caused by the faulty first algorithm.

At step 470, the second algorithm identifier and any inputs to the second algorithm are stored (referred to herein as second inputs). In a computer system with a DIMM lane sparing algorithm, these values may be stored in SPD on each DIMM. As noted above, inputs may comprise operating voltage, frequency, etc.

At step 480, processor 120 executes the second algorithm with the second input or set of inputs and stores one or more results of the second algorithm. The one or more results correct the faulty repair action caused by the first algorithm. The result of the second algorithm is also stored in SPD on the associated DIMM. The second algorithm can also be run for each DIMM in the computer system, with the results stored for each DIMM in its corresponding SPD in step 490. Also, as noted above, these steps can be performed in any suitable order. In some embodiments, the second algorithm is executed and then the algorithm identifier, inputs, and results are stored.

In embodiments described herein, a post-fault solution can be delivered via a firmware update. Improper repair actions can be corrected by marking and recording intermediate data and algorithm versions, and then introducing a version control technique for algorithms that are updated by a firmware update. Costly support and replacement procedures can be reduced via the embodiments described herein. In addition, these actions can be performed transparently to a customer. In typical systems, lane repairs written to DIMM SPD are irreversible through normal means; they simply accumulate until the DIMM is no longer viable. Embodiments herein provide a mechanism to reverse faulty lane repairs.

Embodiments described herein can also speed up complex calculations. If a configuration does not change, or changes in a specific way, it is sometimes not necessary to re-do the computation during each boot. Time savings can be achieved by optimizing when the computations are done. The firmware stores algorithm IDs and inputs used to generate certain results. On each boot, if inputs have not changed, a cached copy can be used. If inputs have changed, prior cached results can be deleted and the computation re-performed. If the algorithm itself is replaced with a firmware update, a re-computation is performed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method for correcting improper repair actions in a computer system, comprising:
   assigning a first algorithm identifier to a first algorithm;
   storing the first algorithm identifier and a first input to the first algorithm;
   executing, via a processor, the first algorithm with the first input and storing one or more results of the first algorithm, wherein the one or more results comprises a repair action;
   determining that the repair action is faulty;
   storing the algorithm identifier for the first algorithm in a blacklist;
   assigning a second algorithm identifier to a second algorithm;
   storing the second algorithm identifier and a second input to the second algorithm;
   executing, via the processor, the second algorithm with the second input, wherein the second algorithm corrects the faulty repair action caused by the first algorithm; and
   storing a result of the second algorithm.

2. The method of claim 1, wherein the repair action further comprises a memory lane sparing action.

3. The method of claim 1, further comprising:
   storing the second algorithm identifier, the second input, and the result of the second algorithm in serial presence data on a memory chip.

4. The method of claim 3, further comprising:
   commencing a system boot sequence that includes the second algorithm;
   determining if the second input to the second algorithm has changed;
   if the second input has not changed, skipping the execution of the second algorithm and reading a cached result of a previous iteration of the second algorithm; and
   continuing the boot sequence.

5. The method of claim 3, further comprising:
   commencing a system boot sequence that includes the second algorithm;

determining if the second input to the second algorithm has changed;
if the second input has changed, execute the second algorithm and store a result of the second algorithm; and
continue the boot sequence.

6. The method of claim 1, wherein the second algorithm is executed as a portion of a firmware update on the computer system.

7. The method of claim 1, further comprising:
commencing a system boot sequence;
retrieving repair information, the second algorithm identifier, and the second input;
if the second algorithm ID is on the blacklist, undo any repair actions as a result of the second algorithm and set a flag for diagnostics of the computer system.

8. The method of claim 1, further comprising:
After storing the result of the second algorithm, running a diagnostic to verify the faulty repair action has been corrected.

9. The method of claim 1, wherein the second algorithm is executed for each memory component in the computer system.

10. The method of claim 1, wherein a checksum is stored for each of the first input and the second input.

11. A system, comprising:
a processor; and
a memory storing a program, which, when executed on the processor, performs an operation for correcting improper repair actions, the operation comprising:
assigning a first algorithm identifier to a first algorithm;
storing the first algorithm identifier and a first input to the first algorithm;
executing, via a processor, the first algorithm with the first input and storing one or more results of the first algorithm, wherein the one or more results comprises a repair action;
determining that the repair action is faulty;
storing the algorithm identifier for the first algorithm in a blacklist;
assigning a second algorithm identifier to a second algorithm;
storing the second algorithm identifier and a second input to the second algorithm;
executing, via the processor, the second algorithm with the second input, wherein the second algorithm corrects the faulty repair action caused by the first algorithm; and
storing a result of the second algorithm.

12. The system of claim 11, wherein the repair action further comprises a memory lane sparing action.

13. The system of claim 11, the operation further comprising:
storing the second algorithm identifier, the second input, and the result of the second algorithm in serial presence data on a memory chip.

14. The system of claim 13, the operation further comprising:
commencing a system boot sequence that includes the second algorithm;
determining if the second input to the second algorithm has changed;
if the second input has not changed, skipping the execution of the second algorithm and reading a cached result of a previous iteration of the second algorithm; and
continuing the boot sequence.

15. The system of claim 13, the operation further comprising:
commencing a system boot sequence that includes the second algorithm;
determining if the second input to the second algorithm has changed;
if the second input has changed, execute the second algorithm and store a result of the second algorithm; and
continue the boot sequence.

16. A computer program product for correcting improper repair actions, the computer program product comprising a computer-readable medium program having program instructions embodied therewith, the program instructions executable by a processor to perform an operation comprising:
assigning a first algorithm identifier to a first algorithm;
storing the first algorithm identifier and a first input to the first algorithm;
executing, via a processor, the first algorithm with the first input and storing one or more results of the first algorithm, wherein the one or more results comprises a repair action;
determining that the repair action is faulty;
storing the algorithm identifier for the first algorithm in a blacklist;
assigning a second algorithm identifier to a second algorithm;
storing the second algorithm identifier and a second input to the second algorithm;
executing, via the processor, the second algorithm with the second input, wherein the second algorithm corrects the faulty repair action caused by the first algorithm; and
storing a result of the second algorithm.

17. The computer program product of claim 16, wherein the repair action further comprises a memory lane sparing action.

18. The computer program product of claim 16, the operation further comprising:
storing the second algorithm identifier, the second input, and the result of the second algorithm in serial presence data on a memory chip.

19. The computer program product of claim 18, the operation further comprising:
commencing a system boot sequence that includes the second algorithm;
determining if the second input to the second algorithm has changed;
if the second input has not changed, skipping the execution of the second algorithm and reading a cached result of a previous iteration of the second algorithm; and
continuing the boot sequence.

20. The computer program product of claim 18, the operation further comprising:
commencing a system boot sequence that includes the second algorithm;
determining if the second input to the second algorithm has changed;
if the second input has changed, execute the second algorithm and store a result of the second algorithm; and
continue the boot sequence.

* * * * *